United States Patent [19]
Roberts

[11] Patent Number: 4,471,158
[45] Date of Patent: Sep. 11, 1984

[54] PROGRAMMABLE HEADER
[75] Inventor: Joseph A. Roberts, Hudson, N.H.
[73] Assignee: Advanced Circuit Technology, Inc., Nashua, N.H.
[21] Appl. No.: 550,986
[22] Filed: Nov. 10, 1983

Related U.S. Application Data
[63] Continuation of Ser. No. 329,889, Dec. 11, 1981, abandoned.

[51] Int. Cl.³ .................................. H01B 5/14
[52] U.S. Cl. ........................ 174/52 FP; 357/70; 361/404; 361/414; 361/421
[58] Field of Search ............ 361/404, 414, 421; 174/52 FP; 357/70

[56] References Cited
U.S. PATENT DOCUMENTS

| | | | |
|---|---|---|---|
| 2,613,252 | 10/1952 | Heibel | 361/421 |
| 3,256,260 | 12/1965 | Brochier et al. | 361/421 X |
| 3,418,535 | 12/1968 | Martinell | 361/414 X |
| 3,441,805 | 4/1969 | Paulson | 361/414 X |
| 3,805,117 | 4/1974 | Hausman | 361/400 X |
| 3,899,305 | 8/1975 | Hilgers et al. | 357/70 X |
| 4,212,120 | 7/1980 | Jones et al. | 174/52 FP |
| 4,214,120 | 7/1980 | Jones et al. | 357/70 X |
| 4,247,864 | 1/1981 | Lockard | 357/70 X |

Primary Examiner—R. R. Kucia
Attorney, Agent, or Firm—Cesari and McKenna

[57] ABSTRACT

A programmable header constructed from an integral lamina circuit arrangement comprising a plurality of electrically conductive pins in fixed spaced relationship, at least one electrically conductive highway, an electrically conductive lowway, a plurality of electrically conductive cross-links each connecting a separate one of said pins to said lowway and a plurality of electrically conductive side-links each connecting a separate one of said pins to a said highway, wherein said highway or highways lie in a plane or planes spaced from and parallel to a plane in which lies said lowway and are superimposed on but spaced from said cross-links, and wherein said pins project normal to said planes in spaced parallel relationship, said lowway and portions of said links being free from said superimposition thereby to facilitate selective removal of desired portions of said links and lowway to break electrical continuity thereof so as to program interconnection between said pins in a desired manner.

20 Claims, 17 Drawing Figures

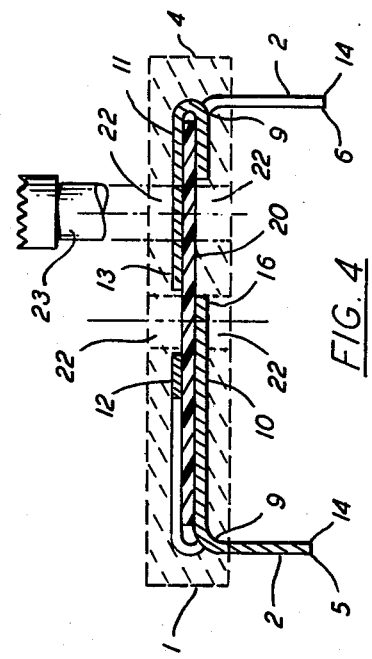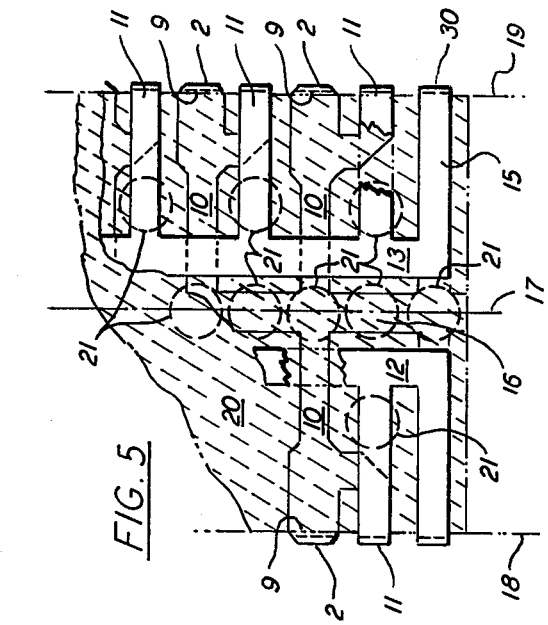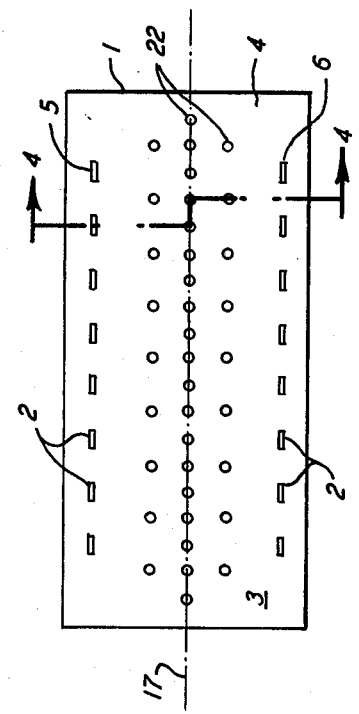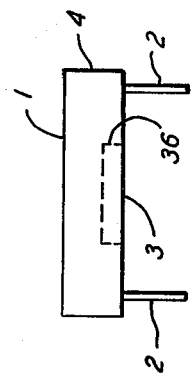

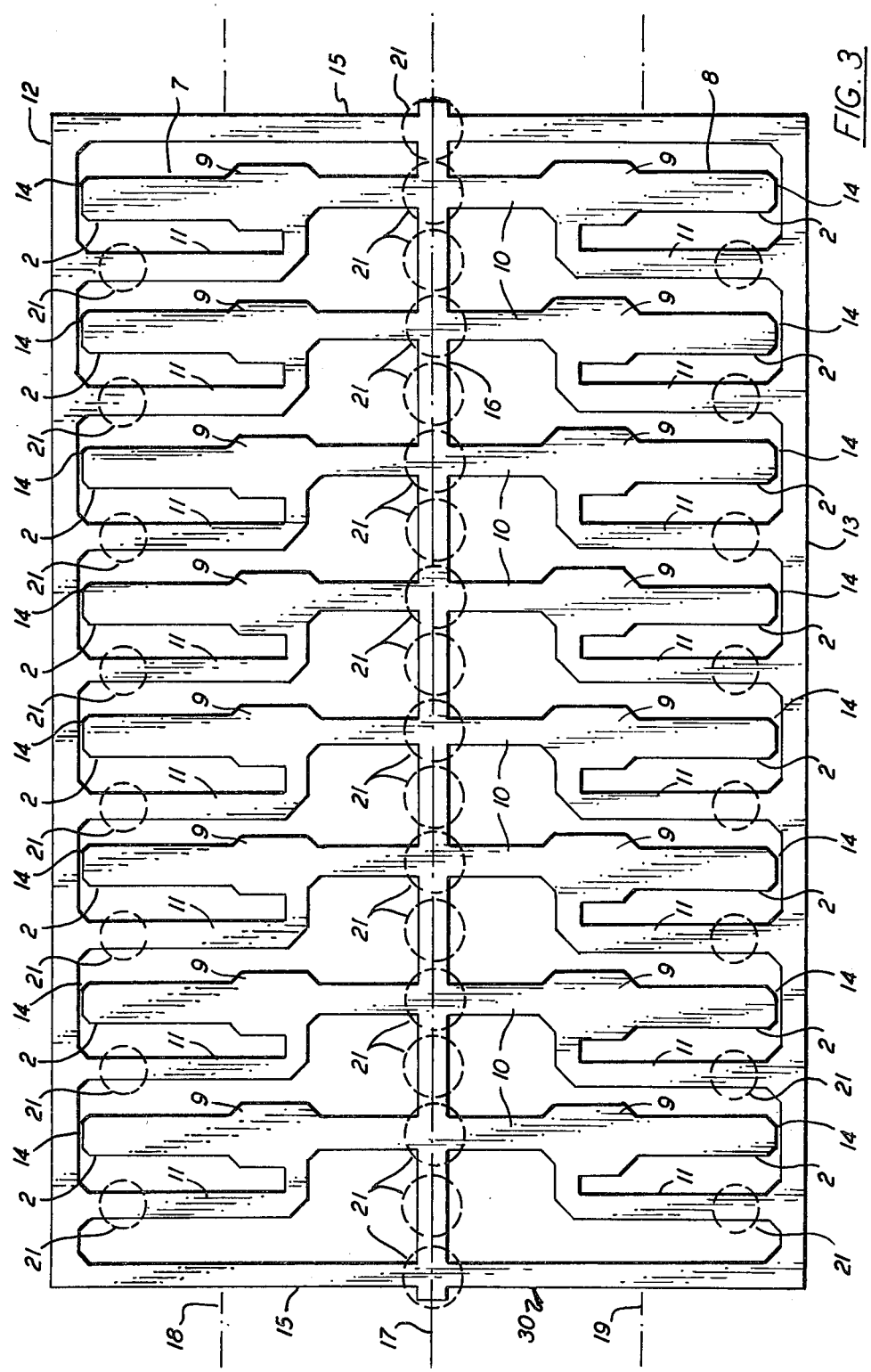

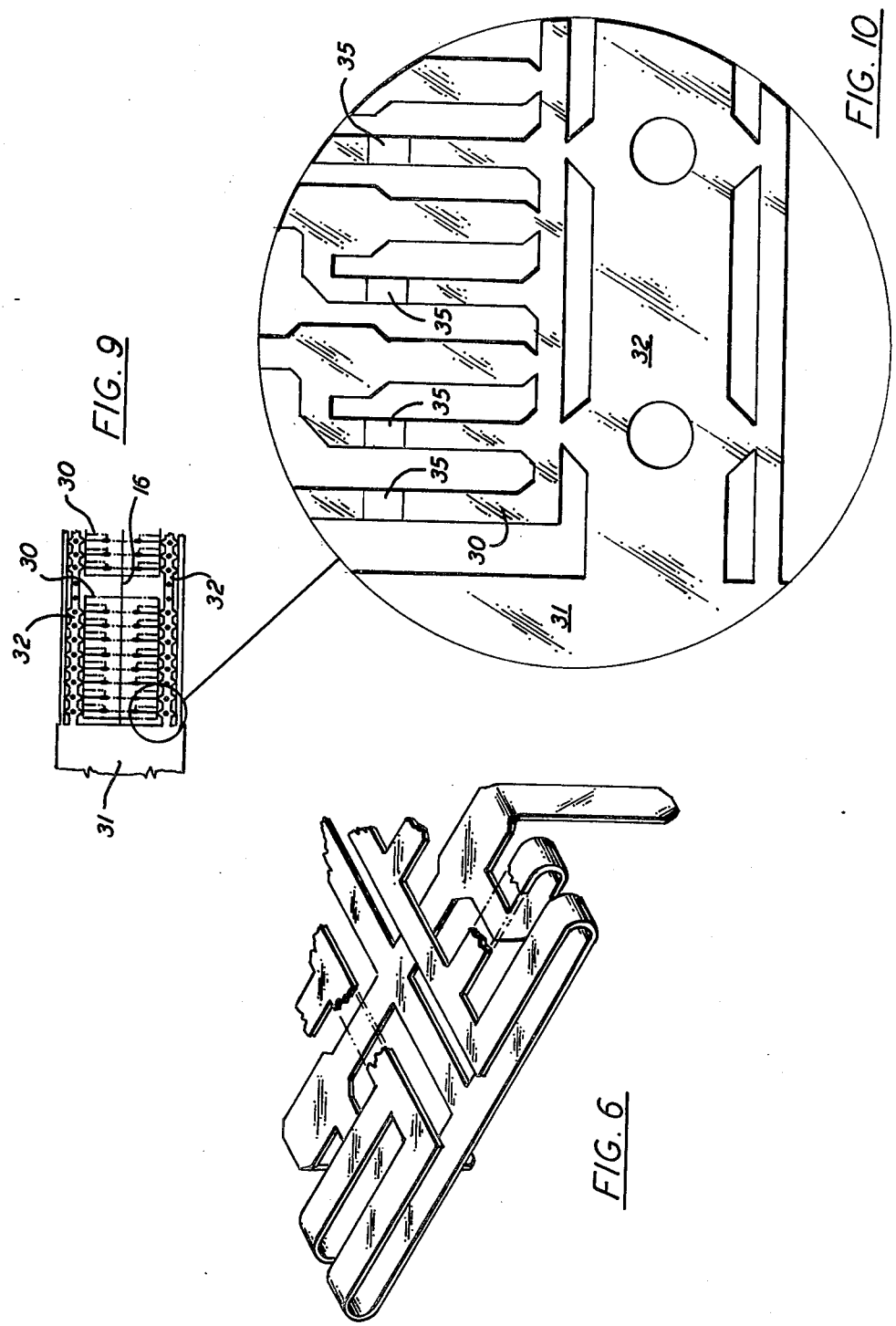

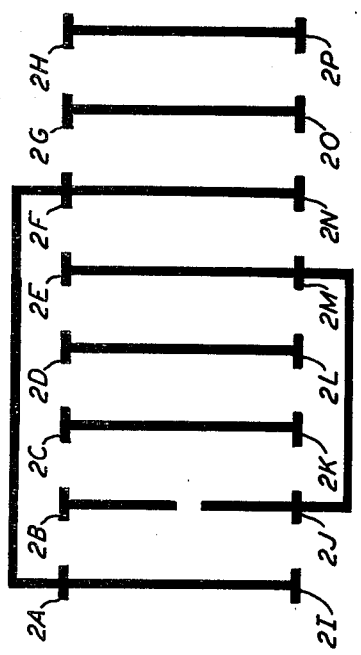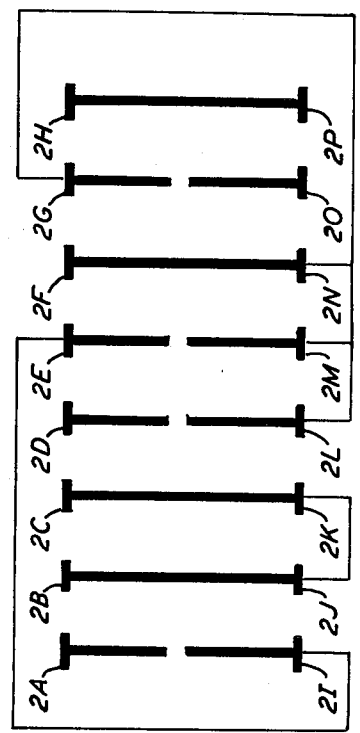

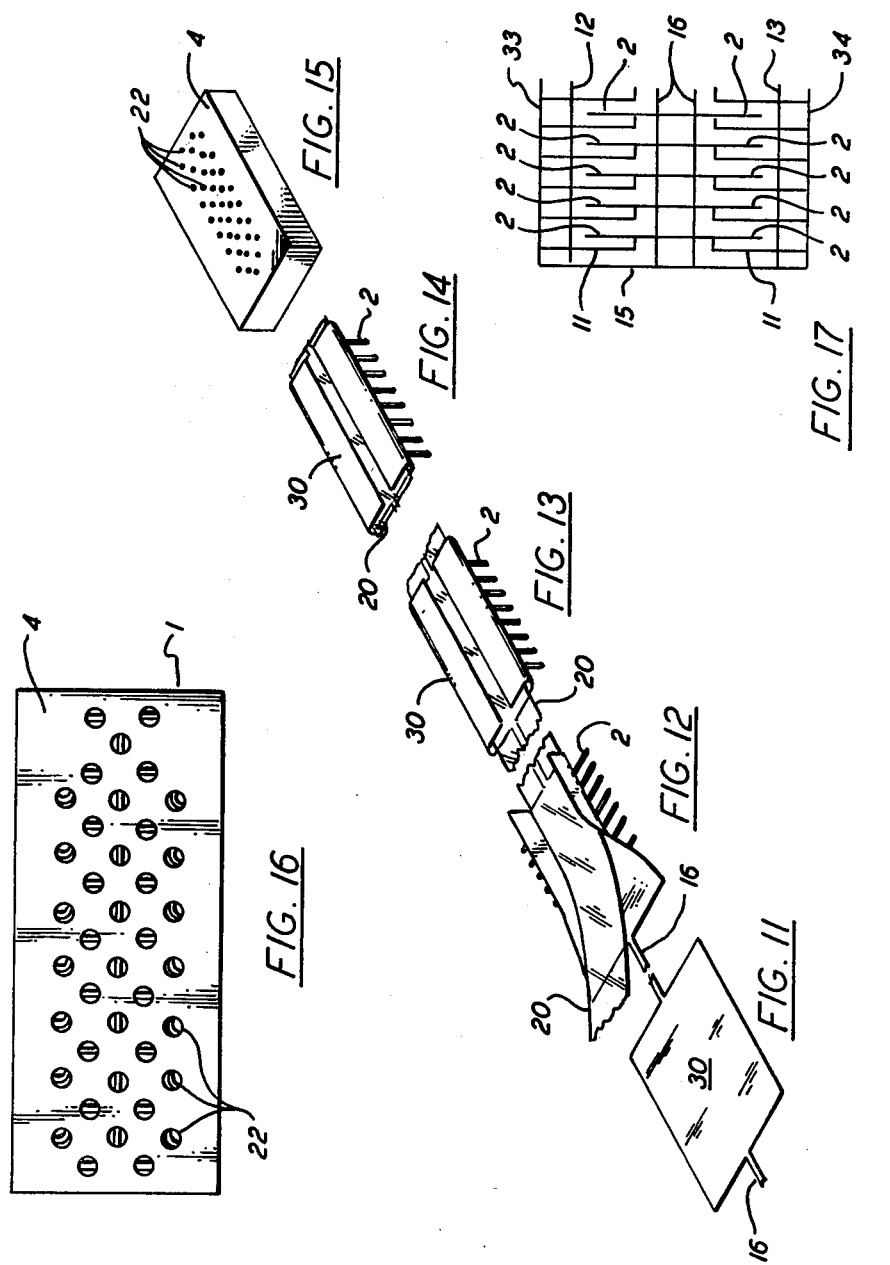

PROGRAMMABLE HEADER

This is a continuation of application Ser. No. 329,889 filed Dec. 11, 1981 now abandoned.

This invention relates to programmable headers and, particularly, though not exclusively, to programmable headers of the dual inline package (DIP) type.

In the prior art there are a number of designs of programmable headers in which the interconnection between opposed pairs of pins of two lines of pins can be programmed as desired. In some of these designs the making and breaking of the interconnection is by means of a switch with each opposed pair of pins being connectable through a separate switch thereby permitting the programming of the interconnections to be adjusted at will. In other arrangements the interconnection between opposed pairs of pins is permanently broken during the programming operation to form a permanent program arrangement in the header. A further form of programmable header involves the use of a plurality of separate pins and terminals which are hard-wired together in a desired manner.

The programmable header using switches is expensive to produce, has a relatively complex mechanical structure which tends to reduce its reliability and is not susceptible to automatic insertion in circuit boards on an automatic component insertion line.

The second form of header referred to which is permanently programmed by severing interconnections between opposed or adjacent pairs of pins is also not susceptible to automatic insertion in printed circuit boards and, although connection between adjacent pins or opposite pairs of pins is provided, is very restricted as to the range of interconnections which can be programmed into the header.

Although the hard wired header can provide any desired complexity of pin interconnection, such a header is relatively expensive to manufacture and program and is prone to failure as a result of the breakdown of electrical connections therein. None of the previously proposed constructions of header facilitate the automatic insertion of the header into a circuit board, or the combination of low cost, coupled with great versatility of programming including the connection of any pin to any other pin without an undesired connection to one or more intermediate pins.

It is an object of the present invention to provide an automatically insertable programmable header which is compact and economical to produce and which permits programming, during manfacture or by the user, of a wide range of interconnections between pins whether located adjacent one another or not.

It is a further object of the present invention to provide a method of constructing such a header.

According to the invention there is provided an integral lamina circuit arrangement comprising a plurality of electrically conductive pins in fixed spaced relationship, an electrically conductive highway, an electrically conductive lowway, a plurality of electrically conductive cross-links each connecting a separate one of said pins to said lowway and a plurality of electrically conductive side-links each connecting a separate one of said pins to said highway.

Also according to the invention there is provided a programmable header constructed from an integral lamina circuit arrangement comprising a plurality of electrically conductive pins in fixed spaced relationship, at least one electrically conductive highway, an electrically conductive lowway, a plurality of electrically conductive cross-links each connecting a separate one of said pins to said lowway and a plurality of electrically conductive side-links each connecting a separate one of said pins to a said highway, wherein said highway or highways lie in a plane or planes spaced from and parallel to a plane in which lies said lowway and are superimposed on but spaced from said cross-links, and wherein said pins project normal to said planes in spaced parallel relationship, said lowway and portions of said links being free from said superimposition thereby to facilitate selective removal of desired portions of said links and lowway to break electrical continuity thereof so as to program interconnection between said pins in a desired manner.

Also according to the invention there is provided a method of producing a programmable header comprising the steps of:

(a) producing an integral lamina circuit arrangement comprising a plurality of electrically conductive pins in fixed spaced relationship, an electrically conductive highway, an electrically conductive lowway, a plurality of electrically conductive cross-links each connecting a separate one of said pins to said lowway and a plurality of electrically conductive side-links each connecting a separate one of said pins to said highway;

(b) folding said links on fold lines placed so that said highway or highways lie in a plane or planes spaced from said parallel to a plane in which lies said lowway and are superimposed on but spaced from said cross-links, and said lowway and portions of said links are free from superimposition to facilitate selective removal of desired portions of said links and lowway to break electrical continuity thereof and (c) bending said pins to project (1) normal to said planes and (2) in spaced parallel relationship to one another.

The invention will now be described, by way of example, with reference to the accompanying drawings, in which:

FIG. 1 is an underview of a 16 pin programmable header according to the invention;

FIG. 2 is an end elevation of the programmable header shown in FIG. 1;

FIG. 3 illustrates the conductive circuit pattern used to form the programmable header shown in FIGS. 1 and 2;

FIG. 4 is a sectional elevation on section line 4—4 shown in FIG. 1 with the outer housing of the header shown in ghost;

FIG. 5 is a fragmentary partially cut away plan view of an end portion of the conductor arrangement within the programmable header of FIGS. 1, 2 and 4;

FIG. 6 is a fragmentary partially cut away perspective view of the conductor arrangement shown in FIG. 5;

FIGS. 7 and 8 diagrammatically illustrate two examples of programmed interconnections possible in the programmable header of FIGS. 1 and 2;

FIGS. 9-15 diagrammatically illustrate the method of forming the programmable header illustrated in FIGS. 1 and 2;

FIG. 16 is a plan view of a programmable header similar to that shown in FIG. 1 with an alternative arrangement for programming the pin interconnections of the header; and FIG. 17 illustrates diagrammatically an alternative conductive circuit arrangement for a programmable header according to the present invention.

With reference to FIGS. 1 and 2, there is illustrated a DIP (Dual Inline Programmable) header 1 having sixteen electrically conductive pins 2 projecting from the undersurface 3 of electrically non-conductive housing 4 in two side-by-side parallel lines 5, 6 of eight parallel pins each. The non-conductive housing 4 is of substantially rectangular construction suitable for automatic handling and insertion at a desired location on a printed circuit board on an automated circuit board component assembly line.

The conductive circuit arrangement interconnecting the pins within the programmable header shown in FIGS. 1 and 2 is illustrated in FIG. 3 and this figure shows the circuit in laminar form as it appears at an early stage during the production of the programmable header. The metallic (e.g. copper, phsophor bronze) conductor arrangement includes the sixeen pins 2 disposed in a mirror image pair of rows 7 and 8 forming eight mirror image pairs of pins with the adjacent ends 9 of each pair of pins being electrically interconnected by a conductive cross-link 10. The adjacent end 9 of each pin of row 7 and the associated cross-link 10 is electrically connected by a conductive side-link 11 to a first electrically conductive highway 12. Similarly, the adjacent ends 9 and associated cross-links 10 of row 8 are individually electrically connected by conductive side-links 11 to a second electrically conductive highway 13. The highways 12 and 13 each extend the length of the rows of pins 7 and 8 adjacent remote ends 14 of the pins 2 and are electrically connected to each other by end-links 15. The centers of the cross-links 10 and end-links 15 are interconnected by an electrically conductive lowway 16 extending parallel to the highways 12 and 13 to form, with the pins 2, cross-links 10, side-links 11, highways 12 and 13 and end-links 15, a mirror image conductive circuit arrangement symmetrically disposed about longitudinal axis 17 which extends centrally along the conductive lowway 16.

For clarity and the convenience of the above description of the circuit arrangement and as illustrated in FIG. 3 the remote ends of the pins 2 are shown spaced from the highways 12 and 13. However, it will be appreciated that during the early stages of manufacture of the circuit arrangement the remote ends 14 and conductive highways 12, 13 may or may not be integral and that during the production of a programmable header these remote ends 14 and highways 12, 13, when integral, are severed from one another as will be described in greater detail hereinafter.

The side-links 11 and end-links 15 are adapted to be folded about fold lines 18 and 19 respectively, the fold lines being parallel to and equally spaced on opposite sides of the axis 17. In addition, the pins 2 of each row are adapted to be bent at adjacent ends 9 to form the parallel lines of pins 5 and 6.

FIGS. 4, 5 and 6 illustrate the conductor arrangement within the housing 4, in which the circuit arrangement of FIG. 3 is disposed in a folded symmetrical layout with the pins 2 projecting from the underside of the housing 4 and with the highways 12 and 13 disposed in spaced apart parallel relationship overlying the cross-links 10 on either side of the lowway 16, with the portions of the circuit arrangement on a level with the highways 12 and 13 being spaced from the portions of the circuit arrangement on the level of the lowway 16 by a layer of Mylar 20 (Trademark of E. I. DuPont de Nemour for polyester film) (FIGS. 4 and 5).

A desired arrangement of interconnections between the pins 2 is achieved by removing one or more portions of the circuit arrangement at the locations 21 shown in ghost FIGS. 3, 4 and 5. Although the removal of this material may take place during the production of the programmable headers by punching, drilling, laser cutting, etc., the programmable header herein described with reference to the drawings is constructed to permit the programming of the interconnections between the pins within the header subsequent to final assembly by the end user. This is achieved by the provision of a plurality of passages 22 extending through the housing 4 at each of the locations 21 thereby to permit removal of the conductive material, as desired at any one or more of the locations 21, by means of a punch 23 (FIG. 4) sized to be guided by the passages 22 and to remove the amount of material at a location 21 required to break electrical continuity thereat. Typically the cross-, side- and end-link and lowway and highway widths may be 0.020 inches wide and the punch 0.025 inches diameter. By selectively removing portions of the circuit arrangement at locations 21, a desired program of interconnections between pins 2 may be achieved with a very wide range of interconnection arrangements being possible in which any pin may be electrically isolated from or left connected to any other pin or pins of the header. Two of the many possible arrangements are illustrated in FIGS. 7 and 8 which show examples of circuit programming of connections between sixteen pins 2A to 2P which may be achieved with the circuit arrangement shown in FIG. 3. Greater versatility of interconnection is possible where additional portions 21 are arranged for removal in each cross-link 10 between the adjacent ends 9 of the pins 2 and the lowway 16.

FIGS. 9 through 15 illustrate a manner of manufacturing a programmable header of the present invention. As shown in FIG. 9 and FIG. 10 (which shows enlarged the portion circled in FIG. 9) a plurality of circuit arrangements 30, each like the circuit arrangement shown in FIG. 3, are sequentially produced from an electrically conductive strip 31 by photoimaging and etching, the arrangements 30 being interconnected by their conductive lowways 16 and being supported by support and transport strips 32 disposed one on either side of the interconnected circuit arrangements 30. Although the method of production of the circuit arrangements is specified here as involving etching, and the associated photoimaging techniques, it will be understood that the circuit arrangements may be formed employing additive techniques, for example, plating up, mechanical stamping techniques, screening on of conductive inks such as metal filled epoxy, etc. Further, it will be understood that similar techniques, including chemical milling (etching) may be used to provide a circuit arrangement in which the thickness of copper layer is as desired, for example to produce pins of greater thickness and rigidity than the other portions of the circuit arrangement. In addition, it will be understood that desired parts of the circuit arrangement may be tinned and/or plated, for example, the portions of the pins 2 which will be exposed may be gold plated.

More specifically, the circuit arrangements 30 are sequentially produced by an etching process as follows. An 0.010 inch thick copper strip is cleaned employing conventional cleaning techniques, and the cleansed surface is then coated at a coating station with a conventional resist layer. A positive resist is preferred so that multiple imaging and developing stages may be employed, if desired (for example, to plate pins with gold). Various positive resists are known in the art and are available commercially. For the purposes of this example AZ type positive resist available from the Shipley Co., Newton, Mass., is used. The resist layer is then exposed to light, at an imaging station, to form a positive art work image of the circuit pathways and pins. Those areas of the resist exposed to light are altered and removed from the sheet in a developing operation in which the strip is immersed in a preferential solvent for the resist (for example, sodium hydroxide solution), and developed at a treating station, with the result that the exposed portions of resist layer are dissolved leaving a resist layer in a positive image of the circuit pathways and pins.

The next step in the process involves contacting the exposed metallic areas of metal foil with an acid etching solution at an etching station. Etching removes the metal from all the uncovered areas of the metal film, leaving the areas of metal film covered by the resist intact.

Following removal of the uncovered areas of the metal film the resist layer is dissolved and the formed circuit arrangement now remaining is tinned, if desired, at a tinning station.

Following formation of the circuit arrangements, in a stamping and folding station (FIG. 12), the remote ends 14 of the pins 2 are severed from highways 12 and 13 and the side-links 11 and end-links 15 are bent, on fold lines 18 and 19, upwardly until their outer portions and highway 12 and 13 lie substantially normal to the pins and portions of the circuit arrangement lying between the fold lines. At the same time the support and transport strips 32 (not shown in FIGS. 11 to 15), which serve to support and convey the serially connected circuit arrangements during production, are severed from the circuit arrangements.

A strip of Mylar is now superimposed over the circuit arrangements (FIG. 12) between the fold lines 18 and 19 and the side-links 11 and end-links 15 are folded on fold lines 18 and 19 over the Mylar strip (FIG. 13), with the Mylar layer preventing electrical communication between the highways 12, 13 and the pins 2 and lowway 16 except by the electrical connection provided by the folded side-links 11 and end-links 15 (FIGS. 12 and 13). Subsequently the pins 2 are bent in the opposite direction to the folding of the side-links and end-links to form the arrangement described with reference to FIGS. 4, 5 and 6. The serial strip of circuit arrangements 30 is then severed into separate discreet programmable header circuit arrangements and male and female moldings are assembled to the circuit arrangement and heat sealed to form the insulative housing 4, with the two rows of pins 5 and 6 projecting therefrom and with the passages 22 formed to permit access, by the punch 23, to each of the locations 21. Alternatively the male and female moldings may be ultrasonically welded to form the housing or the housing may be be a single piece injection molded in place on the circuit arrangement with passages 22 formed at the same time.

Areas 35 (FIG. 10) of the circuit arrangements 30 which are to be bent or folded about fold lines 18, 19 may be etched down or notched to facilitate folding.

An integrated circuit insertion tool engaging slot, groove or recess 36 (shown in phantom in FIG. 2) may be provided in housing 4 to facilitate automated insertion.

FIG. 16 illustrates an alternative layout of portions 21 which are removable to program the header as indicated by the locations of passages 22. This arrangement, in which portions 21 are located (1) in the lowway 16 between each cross-link 10, (2) in cross-link 10 between lowway 10 and associated adjacent end 9, (3) in each end-link 15 on either side of lowway 10 and (4) in each side-link 11 close to its connection to the associated pin 2, permits adequate material to be provided in between passages 22 for housing strength to be maximized.

In an alternative arrangement portions 21 removed by the application of electrical current, therethrough, of a magnitude to fuse the portion. To facilitate this the portions 21 may be of a smaller cross-sectional area than other parts of the circuit arrangement. Of course, when the circuit arrangement is to be programmed during manufacture, the passages 21 may be omitted, if desired.

It will be appreciated that a number of other arrangements utilizing the concept of the present invention are possible. For example, the side-links 11, end-links 15 and pins 2 could all be bent in the same direction so that the highways 12 and 13 underlie rather than overlie the cross-links 10 or the portions folded could be folded in opposite directions so that one highway overlies and the other highway underlies the cross-links.

In a further embodiment of the invention, illustrating but one way in which the inventive concept can be expanded to provide greater range of programmable connections between pins 2, a circuit arrangement as illustrated diagrammatically in FIG. 17 may be used. In this arrangement the side-links 11 and end-links 15 are extended beyond the highways 12 and 13 to a second pair of highways 33 and 34 which extend in spaced relationship parallel to highways 12 and 13. In this arrangement the length of the cross-links 10 is extended in order that an additional lowway 16 may be accommodated and so that, when the side-links and end-links are folded, the highways 12, 13, 33 and 34 all overlie portions of the cross-links between adjacent ends 9 of the pins 2 and the central lowways 16. Many other variations will be apparent to a man skilled in the art including the use of multiple low ways extending in spaced parallel arrangements.

Although the exemplary description of the invention has been with reference to a 16 pin DIP, it will be appreciated that the inventive concept is applicable to other pin arrangements including both DIP and single inline package (SIP) pin configurations and header pin arrangements not falling within these categories, for example, a circular pin arrangement.

In addition the inventive concept extends to constructions of programmable headers in which one or more circuit arrangements as herein described and claimed are superimposed on one or more similar or different circuit arrangements and electrically connected thereto to provide greater programming flexibility. In such an arrangement, with superimposed circuit arrangements both having highways, the side and end-links may be folded in opposite directions.

As used herein "superimposed" includes to "overlie" and to "underlie".

As used herein "highway" is a "electrically conductive side-link interconnecting link".

As used herein "lowway" is an "electrically conductive cross-link interconnecting link".

I claim:

1. An integral lamina circuit arrangement comprising a plurality of electrically conductive pins in fixed spaced relationship, an electrically conductive side-link interconnecting link, an electrically conductive cross-link interconnecting link, a plurality of electrically conductive cross-links each connecting a separate one of said pins to said cross-link interconnecting link and a plurality of electrically conductive side-links each connecting a separate one of said pins to said side-link interconnecting link.

2. A circuit arrangement according to claim 1 wherein there are a plurality of pairs of said pins disposed in two rows with said cross-link interconnecting link disposed therebetween, one said row lying between said cross-link interconnecting link and a first said side-link interconnecting link and the other said row lying between said cross-link interconnecting link and a second said side-link interconnecting link, the pins of said one row being connected by individual said side-links to said first side-link interconnecting link, the pins of said other row being connected by individual said side-links to said second side-link interconnecting link and all said pins being connected by individual said cross-links to said cross-link interconnecting link.

3. A circuit arrangement according to claim 2 wherein electrically conductive end links interconnect said first side-link interconnecting link, said second side-link interconnecting link and said cross-link interconnecting link.

4. A circuit arrangement according to claim 3 wherein said side-link interconnecting links and said cross-link interconnecting link are parallel to one another and the circuit is symmetrically arranged about said cross-link interconnecting link with said links and pins disposed normal to said side-link interconnecting links and said cross-link interconnecting link.

5. A circuit arrangement according to claim 4 wherein there are sixteen pins disposed in two mirror image rows of eight.

6. A circuit arrangement according to claim 4 wherein at least one additional side-link interconnecting link is disposed parallel to said first and second side-link interconnecting links and is electrically connected conductively to said first or second side-link interconnecting link by extensions of the side-links associated with that side-link interconnecting link.

7. A circuit arrangement according to claim 5 wherein at least one additional cross-link interconnecting link is disposed between said rows of pins parallel to the first said cross-link interconnecting link and is electrically connected conductively thereto by extensions of said cross-links.

8. A circuit arrangement according to claim 1 wherein said pins project normal to the lamina in spaced parallel relationship.

9. A circuit arrangement according to claim 1 wherein portions of said cross-link interconnecting links and links have broken electrical continuity to provide a desired programming of interconnection between said pins.

10. A programmable header constructed from a circuit arrangement according to claim 1 wherein said side-link interconnecting link or side-link interconnecting links lie in a plane or planes spaced from and parallel to a plane in which lies said cross-link interconnecting link and are superimposed on but spaced from said cross-links, and wherein said pins project normal to said planes in spaced parallel relationship, said cross-link interconnecting link and portions of said links being free from said superimposition thereby to facilitate selective removal of desired portions of said links and cross-link interconnecting link to break electrical continuity thereof so as to program interconnection between said pins in a desired manner.

11. A programmable header according to claim 10 wherein the superimposed portions are spaced by a layer of electrically insulating material.

12. A programmable header according to claim 10 comprising an insulative housing encompassing the circuit arrangement except for said pins which project in spaced parallel arrangement from said housing, said housing having passages extending therethrough normal to said planes to provide access to said desired portions of said links and cross-link interconnecting links to facilitate said selective removal.

13. A programmable header according to claim 12 wherein said passages are located at each interconnection of said cross-link interconnecting link and a link, between each such interconnection on said cross-link interconnecting link and on each side-link.

14. A programmable header according to claim 13 wherein each said passage is adapted to guide a portion removing punch.

15. A programmable header according to claim 12 wherein said housing is adapted for use in a circuit board auto-component insertion arrangement.

16. A programmable header according to claim 12 wherein the header is in the form of a dual inline package.

17. A programmable header according to claim 10 wherein portions of said cross-link interconnecting links and links have broken electrical continuity to provide a desired programming of interconnection between said pins.

18. A programmable header according to claim 12 wherein portions of said cross-link interconnecting links and links have broken electrical continuity to provide a desired programming of interconnection between said pins.

19. A programmable header according to claim 10 wherein said selective removal is achieved by applying an electrical current to said desired portions, said current being of a magnitude to fuse said desired portions.

20. A circuit arrangement according to claim 1, wherein desired portions of said arrangement are of a smaller cross-sectional area, relative to other portions of said arrangement, thereby to facilitate removal of said desired portions.

* * * * *